United States Patent [19]
Lin

[11] Patent Number: 5,684,676
[45] Date of Patent: Nov. 4, 1997

[54] CLIP FOR SECURING HEAT DISSIPATOR TO COMPUTER CENTRAL PROCESSING UNIT

[76] Inventor: Chuen-Sheng Lin, No. 31, Sec. 1, Min Yi Road, Wu-Ku Hsiang, Taipei Hsien, Taiwan

[21] Appl. No.: 568,424

[22] Filed: Dec. 6, 1995

[51] Int. Cl.[6] .................................................. H05K 7/20
[52] U.S. Cl. ...................... 361/704; 165/80.3; 165/185; 174/16.3; 248/510; 257/718
[58] Field of Search ........................... 24/457–459, 517; 165/80.2, 80.3, 185; 174/16.3; 248/505, 510, 316.7; 257/718–719, 726–727; 361/697, 704, 707, 709–710, 715, 717–718, 722

[56] References Cited

U.S. PATENT DOCUMENTS

| | | | |
|---|---|---|---|
| 5,208,731 | 5/1993 | Blomquist | 361/704 |
| 5,396,402 | 3/1995 | Perugini et al. | 361/704 |
| 5,448,449 | 9/1995 | Bright et al. | 361/704 |
| 5,542,468 | 8/1996 | Lin | 361/710 |

*Primary Examiner*—Gregory D. Thompson
*Attorney, Agent, or Firm*—Alfred Lei

[57] ABSTRACT

A clip for securing a heat dissipator to a computer central processing unit is disclosed, including an elongated body made of an elastically deformable material, having a central section to be placed on a top surface of the heat dissipator and two end sections extending from the central section and inclined relative to the top surface of the heat dissipator to define therebetween gaps for accommodating elastic deformation thereof. A vertical extension is provided on the first end section, having a side cutout to define a hook having a side opening for laterally moving into engagement with a first sideways projection on a socket to which the central processing unit is mounted. The second end section has pivotal pin holes formed thereon to respectively receive two limbs extending from two ends of a U-shaped member so as to allow the U-shaped member to be freely rotatable relative to the second end section so that by having the hooked end of the first end section engaging the first sideways projection of the socket and elastically deforming the clip body against the top surface of the heat dissipator, the U-shaped member is allowed to rotate relative to the second end section to engage a second sideways projection of the socket so as to secure the heat dissipator and the central processing unit to the socket.

6 Claims, 6 Drawing Sheets

5,684,676

CLIP FOR SECURING HEAT DISSIPATOR TO COMPUTER CENTRAL PROCESSING UNIT

FIELD OF THE INVENTION

The present invention relates to a clip structure for securing a heat dissipator, which is also referred to as heat sink, and a computer central processing unit (CPU) to a socket mounted on a mother board or a circuit board and in particular to a clip for securing the heat dissipator and the CPU to a ZIF socket.

BACKGROUND OF THE INVENTION

ZIF type CPU connections have been widely used. Such a ZIF connection of a CPU to a socket requires a clip or fastener to secure the CPU, together with a heat dissipator, to the socket. In FIG. 7 of the attached drawings, a conventional clip, which is designated with the reference numeral 1, is used to secure the heat dissipator 4 and the CPU 3 to the socket 2. The clip 1 is generally an elongated member having a flat central section and two inclined end sections for the provision of resiliency. At the free end of each of the end sections, a fastening member 11 is provided, comprising a slot 12 to engage a sideways projection 21 formed on the socket 2. Manual operation tabs 13 are provided on each of the fastening members 11 to control rotation of the fastening member 11 relative to the clip body for engaging and disengaging the hole 12 with the sideways projection 21.

By placing the clip 1 within a non-fined channel on a top surface of the heat dissipator 4 and pushing the end sections of the clip 1 toward the top surface to allow the slots 12 of the fastening members 11 to engage the sideways projections 21, the spring-back force of the deformed end sections secures the heat dissipator 4 and the CPU 3 on the socket 2.

A disadvantage associated with such a conventional design is that it requires to move (rotate) at least one fastening member relative to the socket by means of the manual operation tabs and space is required to accommodate the manual operation. For a more compact computer design, such a operation may be difficult to achieve or even impossible.

Further it needs the user to simultaneously press the end sections and move the manual operation tabs with his or her fingers and this may sometimes hurts the user's fingers.

It is therefore desirable to provide a computer CPU and heat dissipator fastening clip to overcome the above-mentioned drawbacks.

SUMMARY OF THE INVENTION

The principal object of the present invention is to provide a CPU heat dissipator clip structure which overcome the drawbacks of the prior art and can be used in a more limited space.

In accordance with the present invention, there is provided a clip for securing a heat dissipator to a computer central processing unit, comprising an elongated body made of an elastically deformable material, having a central section to be placed on a top surface of the heat dissipator and two end sections extending from the central section and inclined relative to the top surface of the heat dissipator to define therebetween gaps for accommodating elastic deformation thereof. A vertical extension is provided on the first end section, having a side cutout to define a hook having a side opening for laterally moving into engagement with a first sideways projection on a socket to which the central processing unit is mounted. The second end section has pivotal pin holes formed thereon to respectively receive two limbs extending from two ends of a U-shaped member so as to allow the U-shaped member to be freely rotatable relative to the second end section so that by having the hooked end of the first end section engaging the first sideways projection of the socket and elastically deforming the clip body against the top surface of the heat dissipator, the U-shaped member is allowed to rotate relative to the second end section to engage a second sideways projection of the socket so as to secure the heat dissipator and the central processing unit to the socket.

BRIEF DESCRIPTION OF THE DRAWINGS

The present invention will be better understood from the following description of preferred embodiments thereof, with reference to the attached drawings, wherein.

DETAILED DESCRIPTION OF THE PREFERRED EMBODIMENTS

Figure 1:
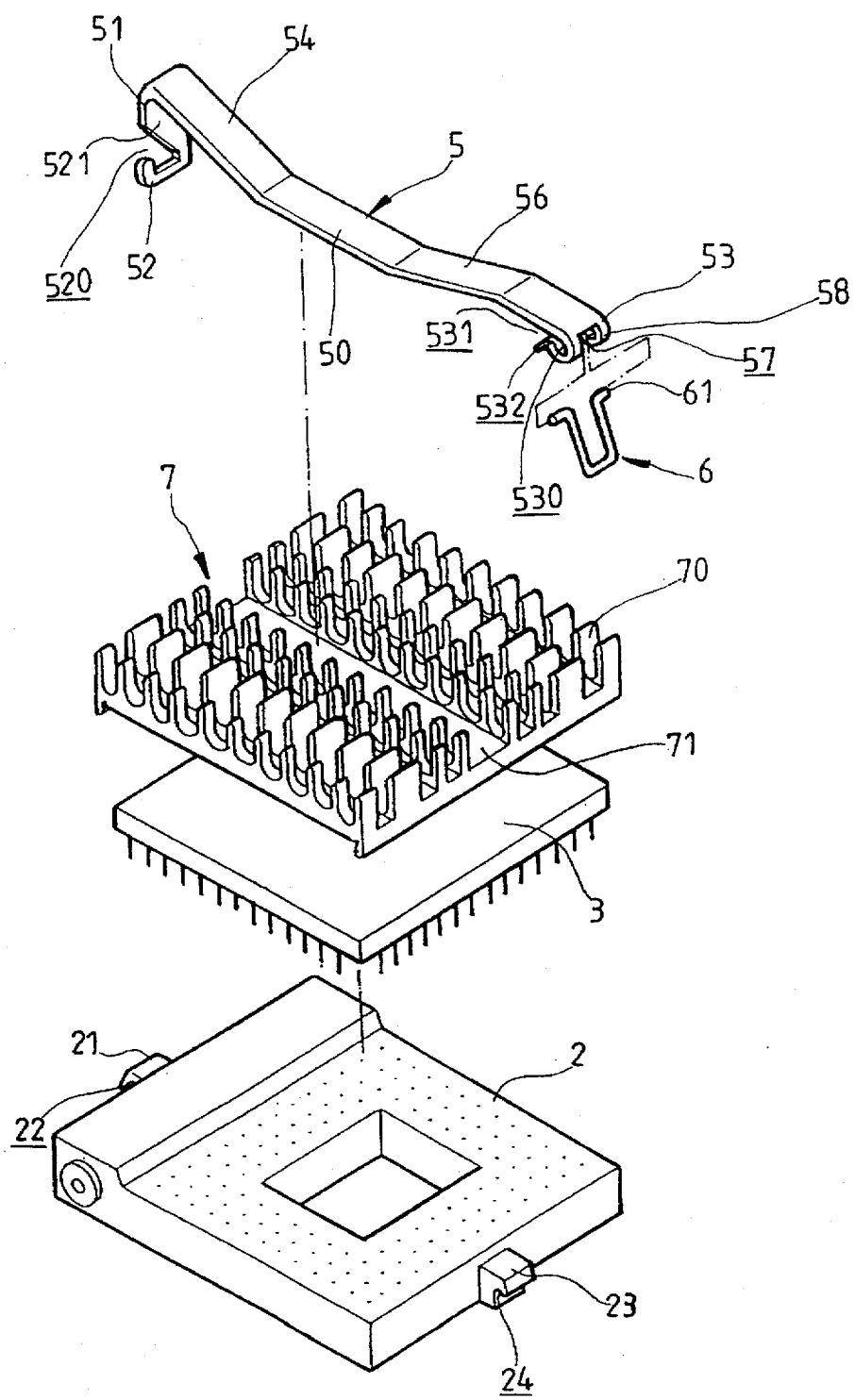
FIG. 1 is an exploded perspective view showing a clip constructed in accordance with a first embodiment of the present invention, securing a heat dissipator and a computer central processing unit to a socket.
Figure 2:
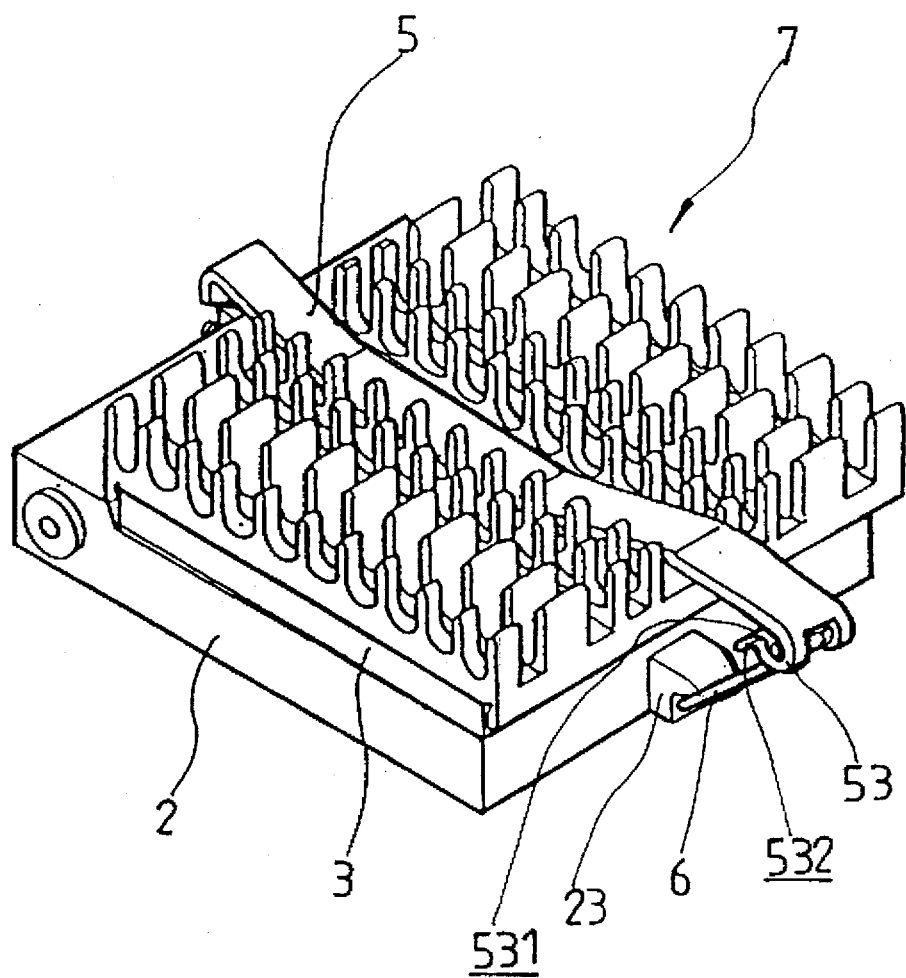
FIG. 2 is a perspective view showing the first embodiment clip securing the heat dissipator and the computer central processing unit to the socket.
Figure 3:
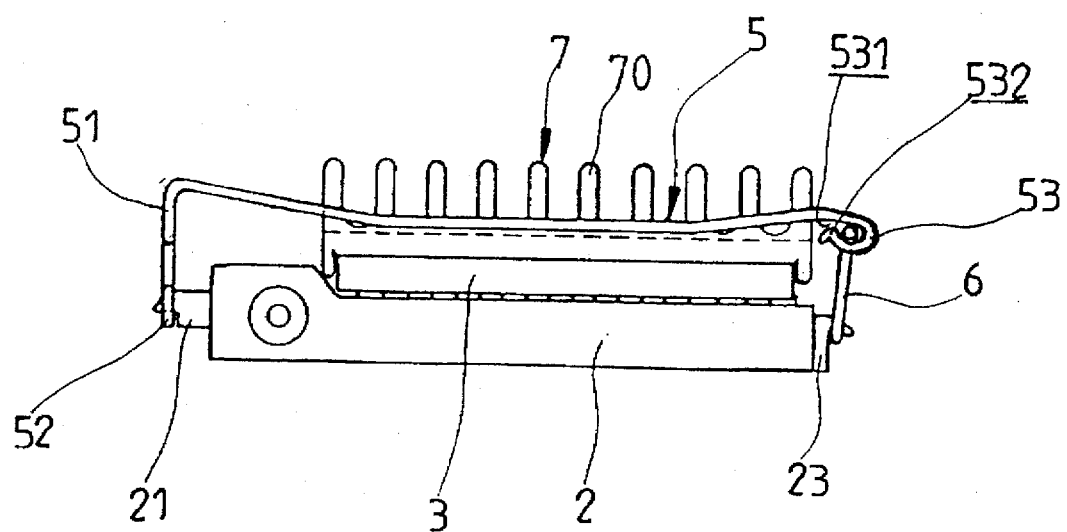
FIG. 3 is a side elevational view showing the first embodiment clip securing the heat dissipator and the computer central processing unit to the socket.

With reference to the drawings and in particular to FIGS. 1–3, wherein a clip constructed in accordance with a first embodiment of the present invention, generally designated with the reference numeral 5, is shown securing a heat dissipator (also referred to as heat sink) 7 and a computer central processing unit (CPU) 3 to a socket 2 which is electrically connected to a mother board or a circuit board (not shown) with pins of the CPU 3 received and electrically connected to pin holes formed on the socket 2, the clip 5 comprises an elongated strip-like body, made of a resilient and elastically deformable material, such as metal, having a flat central section 50 and two inclined end sections 54 and 56. To receive the elongated strip-like clip 5, the heat dissipator 7, which generally has a plurality of fins 70 arranged on a top surface of the heat dissipator 7 for heat dissipation, has a non-finned channel 71 across the top surface.

To simplify the description herein, the top surface of the heat dissipator which is in general a flat surface is defined as horizontal regardless how it is actually oriented. Any direction parallel with the surface is considered "horizontal" and that perpendicular thereto "vertical".

The flat central section 50 of the clip 5 is disposed within the non-finned channel 71 and is substantially in surface contact with the top surface of the heat dissipator 7 so as to be horizontally oriented with the end sections 54 and 56 inclined away from the top surface to define gaps therebetween for accommodation of elastic deformation thereof. At remote end of each of the end sections 54 and 56, a fastening device is provided, which will be referred to as first and second fastening devices.

The first fastening device comprises a vertical section 51 extending from the first end section 54 in a vertical direction so as to have a lower end thereof extending toward the socket 2 located beneath the CPU 3 and the heat dissipator 7. A hook or catch 52 is provided on the lower end of the vertical section 51 of the first fastening device by forming a cutout on one of two opposite lateral sides of the vertical section 51. Corresponding to the hook 52, a first sideways projection 21 is provided on the socket 2 with a recess or slot 22 formed thereon for receiving and engaging the hook 52.

The hook 52, being formed by a side cutout, comprises a lateral side opening 520 which allows the hook 52 to engage the slot 22 of the first projection 21 of the socket 2 in a sideways movement. This is particularly advantageous where only a very limited spaced is available in a computer in which the heat dissipator is to be installed. Preferably, the side cutout assumes a triangular configuration and thus defining an inclined edge 521 of the side opening 520 so as to enhance the mechanical strength of the hook 52.

The second fastening device comprises a pivotal joint section 53 which defines pivotal pin holes 530 formed by bending the remote end portion of the second end section 56 backward to overlap itself so as to provide a gap which preferably comprises a circular-sectioned space between the second end section 56 and the bent and overlapping end portion. The gap is so shaped as to define an opening 531 and the inner circular space surrounded by the end section 56 to form the pin holes 530 with a neck or reduced gap 532 therebetween. Preferably, the bent end portion of the second end section 56 has a cutout 57 extending in the lengthwise direction of the clip body so as to define two separate and opposite branches 58 which after being bent, define two spaced but aligned pin holes 530 with a central opening defined by the cutout 57.

The second fastening device further comprises a U-shaped member 6, preferably made of a resilient and elastically deformable material, such as metal, which has two limbs 61 extending from two ends of the U shape and opposite to each other to serve as pivotal pins rotatably receivable within the pin holes 530 so that the U-shaped member 6 is substantially free to rotate about the pivotal joint section 53 with the U-shaped portion thereof moving within the cutout 57.

The openings 531 are preferably made wide open for easy insertion of the limbs 61 of the U-shaped member 6 into the inner circular space 530 of the pivotal joint section 53.

The socket 2 has a second sideways projection 23 having a recess or slot 24 to receive and engage the U-shaped member 6.

In use, with the CPU 3 plugged in the socket 2 and the heat dissipator 7 placed on the CPU 3, the hook 52 is placed to engage the first sideways projection 21 which may be done by sideways movement of the hook 52 in a very limited space. The central section 50 of the clip 5 then rests on the top surface of the heat dissipator 7. The central section 50 may be completely in contact with the top surface of the heat dissipator 7 at this point due to the inclination of the first end section 54. Then by pushing or elastically deforming the second end section 56 toward the heat dissipator 7, the central section 50 is brought to fully contact with the top surface of the heat dissipator 7. By further forcing or deforming the second end section 56 toward the top surface of the heat dissipator 7, the U-shaped member 6 of the second fastening device is now allowed to engage and is thus fixed to the second sideways projection 23 of the socket 2.

The inclination of the end sections 54 and 56 is such that the end sections 54 and 56 have to undergo elastic deformation to allow the first and second fastening devices to both engage the sideways projections 21 and 23 of the socket 2. The deformation of the end sections 54 and 56 provides a spring-back force thereof on the heat dissipator 7 through the central section 50 of the clip 5 so as to securely mount the heat dissipator 7 and the CPU 3 to the socket 2 in a releasable manner.

Figure 4:
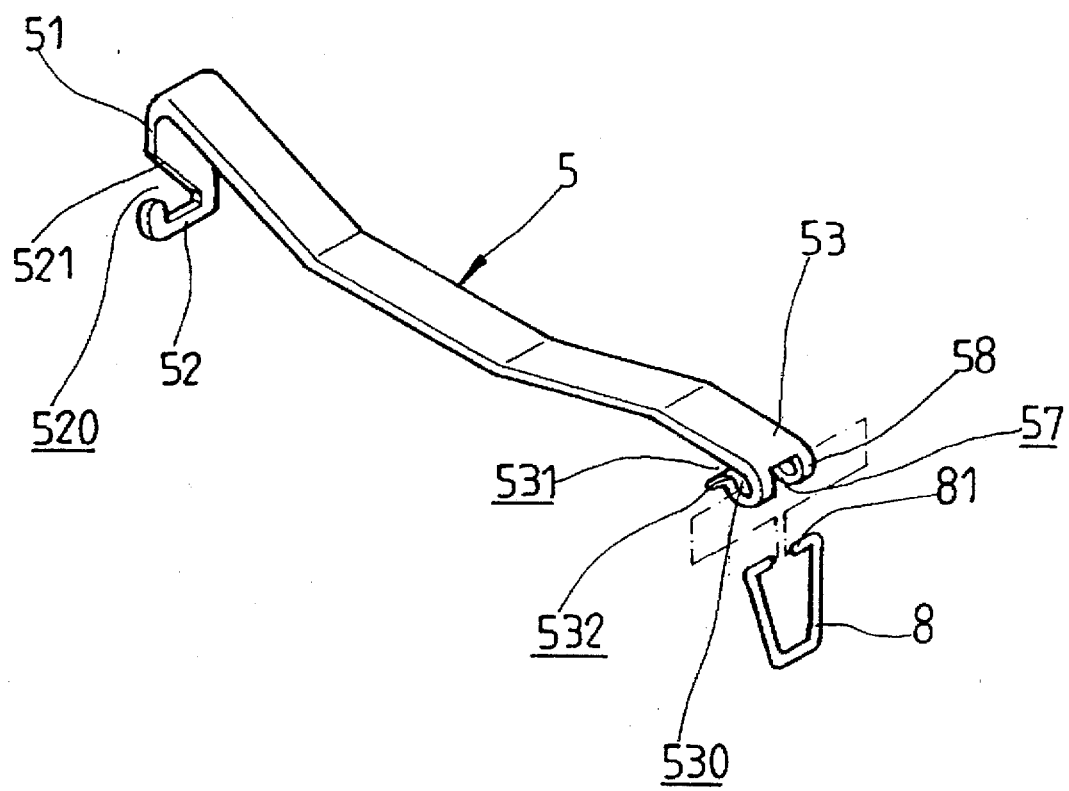
FIG. 4 is a perspective view showing a clip constructed in accordance with a second embodiment of the present invention.

In FIG. 4, a second embodiment of the clip 5 in accordance with the present invention is shown, in which the U-shaped member of the second fastening device, which is now designated with the reference numeral 8, has two limbs 81 extending from the two ends of the U shape 8 and toward each other. The U-shaped member 8 may be made resilient so as to be elastically deform to widely open the U for inserting the limbs 81 into the pivotal pin holes 530 of the pivotal joint section 53 of the clip 5.

Figure 5:
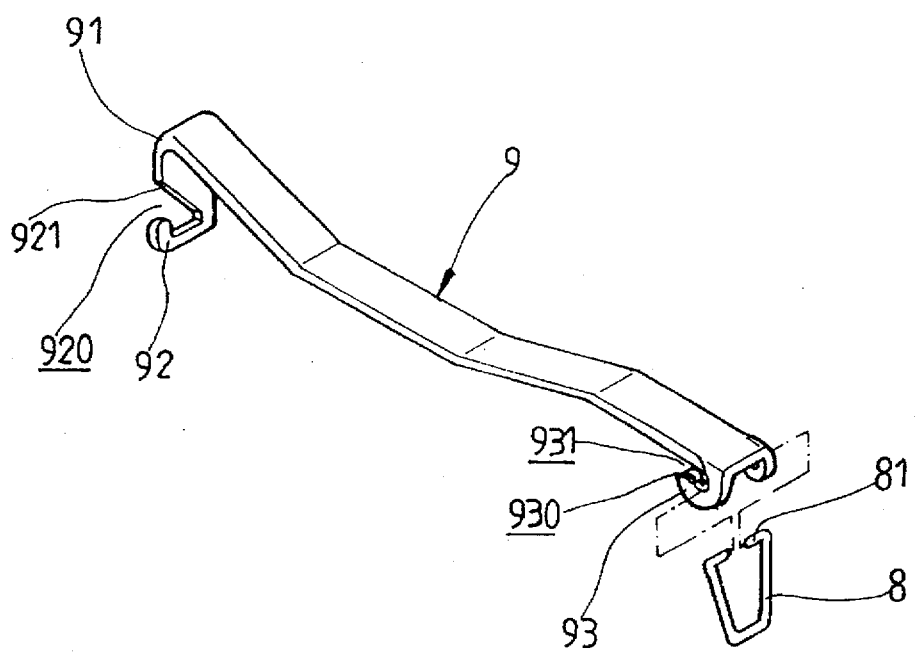
FIG. 5 is a perspective view showing a clip constructed in accordance with a third embodiment of the present invention.
Figure 7:
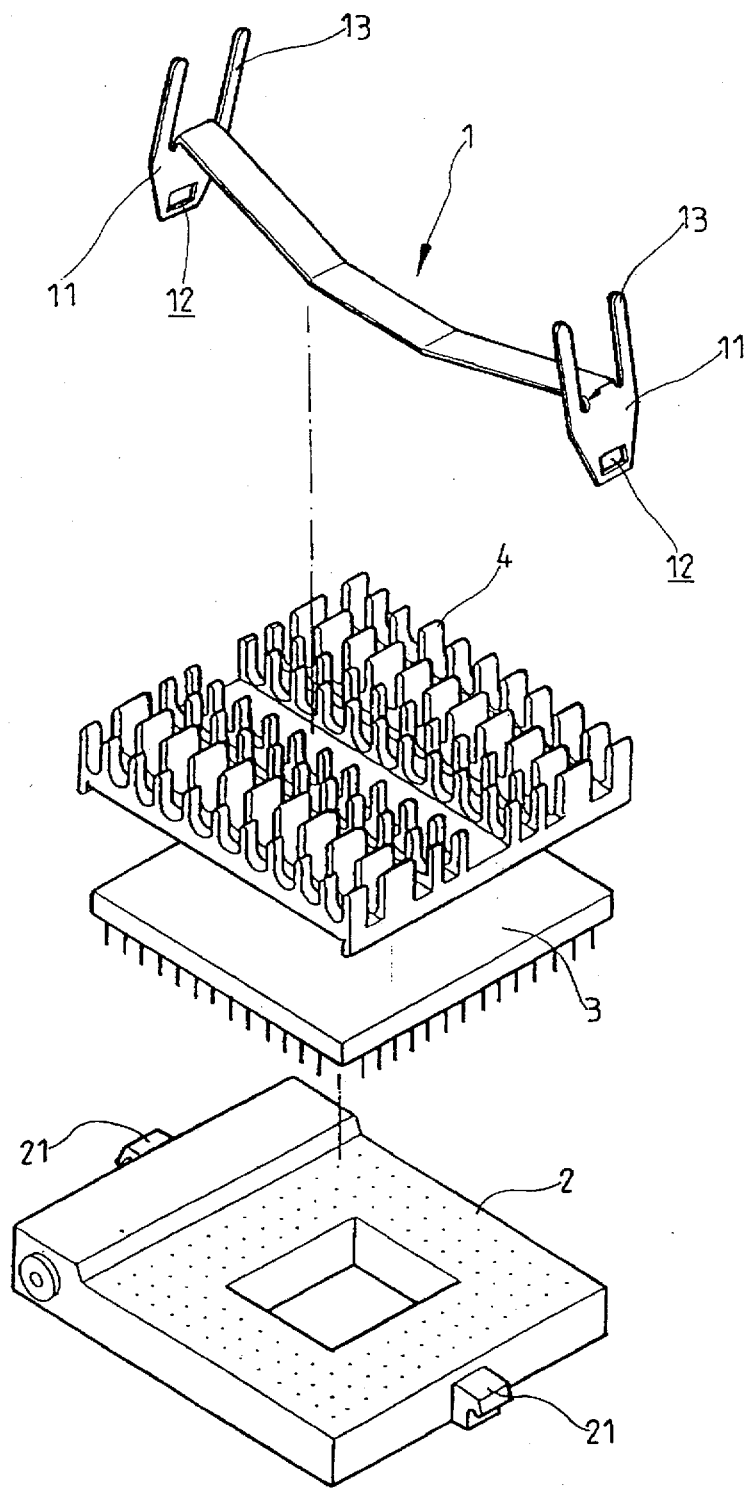
FIG. 7 is an exploded perspective view showing a prior art clip securing a heat dissipator and a computer central processing unit to a socket.

In FIG. 5, a third embodiment of the clip of the present invention is shown, the third embodiment clip which is now designated with the reference numeral 9, comprising a central section 90 and two inclined end sections 94 and 96 with the first end section 94 having a vertical member 91 mounted thereto and having a side opening 92, preferably with a sloping edge 921 for strength purpose, to define a hook which constitutes a first fastening device and the second end section 96 having a pivotal joint 93 defined by pin holes 932 with openings 931 for rotatably receiving therein the limbs 81 of the U-shaped member 8.

Figure 6:
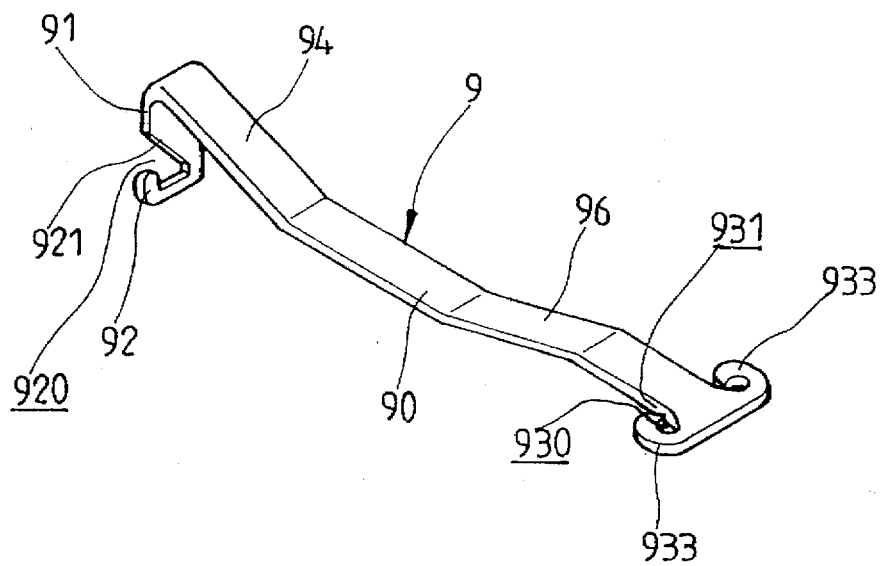
FIG. 6 is a perspective view showing a blank for making the third embodiment clip of the present invention.

The clip may be made from a blank shown in FIG. 6 which has on the second end section 96 two side lugs 933 each having a central hole, defining the pin hole 930, with an opening 931. By bending the side lugs 933 to be vertical or normal to the central section 90, the central holes 933 define the pivotal pin holes for receiving therein the limbs 81 of the U-shaped member 8.

Although preferred embodiments have been described to illustrate the present invention, it is apparent that changes and modifications in the specifically described embodiments can be carried out without departing from the scope of the invention which is intended to be limited only by the appended claims.

What is claimed is:

1. A clip adapted to releasably secure a heat dissipator and a computer central processing unit to a socket with the central processing unit interposed between the socket and the heat dissipator, the heat dissipator having a top surface with fins thereon and defining a non-finned channel thereon, the central processing unit having a plurality of pins to electrically engage pin holes provided on the socket and the socket having first and a second sideways projections, the clip comprising an elongated body made of a resilient and elastically deformable material having a substantially flat central section to be disposed on the top surface of the heat dissipator and within the non-finned channel and a first and a second end section extending from the central section in an inclined manner so as to define a gap with the top surface of the heat dissipator, the first end section comprising a first fastening device having a vertical portion extending in a direction substantially normal to the central section, the vertical portion having a cut-out formed on a first one of two lateral sides thereof so as to divide the vertical extension into a route segment extending from the first end section of the clip body and a hooking segment which is connected to the route segment at a second one of the lateral sides so as to define a catch with a lateral side opening to be engageable with the first sideways projection of the socket in a lateral movement manner, the second end section having a second fastening device so arranged that by having the catch of the first end section engaging the first sideways projection of the socket and elastically deforming the clip body, the second fastening device is allowed to engage the second sideways projection of the socket and thus securing the heat dissipator and the central processing unit to the socket by means of the elasticity provided by the deformed clip body.

2. The clip as claimed in claim 1, wherein the cutout has a triangular configuration so as to define inclined edge with the root segment for enhancing mechanical strength of the catch.

3. A clip adapted to releasably secure a heat dissipator and a computer central processing unit to a socket with the central processing unit interposed between the socket and the heat dissipator, the heat dissipator having a top surface with fins thereon and defining a non-finned channel thereon, the central processing unit having a plurality of pins to electrically engage pin holes provided on the socket and the socket having a first and a second sideways projections, the clip comprising an elongated body made of a resilient and elastically deformable material having a substantially flat central section to be disposed on the top surface of the heat dissipator and within the non-finned channel and a first and a second end sections extending from the central section in an inclined manner so as to define a gap with the top surface of the heat dissipator, the first end section comprising a first fastening device engageable with the first sideways projection of the socket, the second end section comprising a second fastening device having pivotal pin holes formed thereon, a U-shaped member having two sideways extending limbs received within the pivotal pin holes to be freely rotatable relative to the second end section and being so dimensioned that by having the first fastening device engaging the first sideways projection of the socket and elastically deforming the clip body against the top surface of the heat dissipator, the U-shaped member is allowed to engage the second sideways projection of the socket and thus securing the heat dissipator and the central processing unit to the socket by means of the elasticity provided by the deformed clip body, wherein the U-shaped member has two opposite ends and wherein the limbs extend from the ends of the U-shaped member toward each other.

4. A clip adapted to releasably secure a heat dissipator and a computer central processing unit to a socket with the central processing unit interposed between the socket and the heat dissipator, the heat dissipator having a top surface with fins thereon and defining a non-finned channel thereon, the central processing unit having a plurality of pins to electrically engage pin holes provided on the socket and the socket having a first and a second sideways protections, the clip comprising an elongated body made of a resilient and elastically deformable material having a substantially flat central section to be disposed on the top surface of the heat dissipator and within the non-finned channel and a first and a second end sections extending from the central section in an inclined manner so as to define a gap with the top surface of the heat dissipator, the first end section comprising a first fastening device engageable with the first sideways projection of the socket, the second end section comprising a second fastening device having pivotal pin holes formed thereon, a U-shaped member having two sideways extending limbs received within the pivotal pin holes to be freely rotatable relative to the second end section and being so dimensioned that by having the first fastening device engaging the first sideways projection of the socket and elastically deforming the clip body against the top surface of the heat dissipator, the U-shaped member is allowed to engage the second sideways projection of the socket and thus securing the heat dissipator and the central processing unit to the socket by means of the elasticity provided by the deformed clip body, wherein the pivotal pin holes are formed by bending and an end portion of the second end section, which has a cutout thereon for separating the end portion into two spaced branches, to overlap itself so as to define two substantially circular spaces within the unbent portion of the second end section, the circular spaces being spaced by the cutout of the end portion.

5. The clip as claimed in claim 4, wherein the bent end portion of the second end section defines an opening at remote end tips thereof with the unbent portion of the second end section.

6. The clip as claimed in claim 5, wherein the bent end portion of the second end section defines a reduced gap with the unbent portion of the second end section between the openings and the circular spaces.

* * * * *